(12) United States Patent
Kim

(10) Patent No.: US 7,892,920 B2
(45) Date of Patent: Feb. 22, 2011

(54) METHOD FOR MANUFACTURING SEMICONDUCTOR DEVICE INCLUDING IMPLANTING THROUGH A HOLE PATTERNED FROM A FIRST PHOTORESIST AN OXIDE AND A SECOND PHOTORESIST

(75) Inventor: Myung-Soo Kim, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 251 days.

(21) Appl. No.: 12/249,931

(22) Filed: Oct. 12, 2008

(65) Prior Publication Data

US 2009/0102022 A1 Apr. 23, 2009

(30) Foreign Application Priority Data

Oct. 23, 2007 (KR) .................. 10-2007-0106466

(51) Int. Cl.
*H01L 21/8242* (2006.01)
*H01L 21/46* (2006.01)
*H01L 21/76* (2006.01)
*H01L 21/301* (2006.01)
*H01L 21/31* (2006.01)
*H01L 21/469* (2006.01)

(52) U.S. Cl. .................. 438/254; 438/456; 438/788
(58) Field of Classification Search ................ 438/254, 438/788, 456; 257/E29.111, E21.473
See application file for complete search history.

(56) References Cited

FOREIGN PATENT DOCUMENTS

KR 10-1998-050152 9/1998
KR 10-2006-0006597 1/2006

*Primary Examiner*—William M. Brewster
(74) *Attorney, Agent, or Firm*—Sherr & Vaughn, PLLC

(57) ABSTRACT

A method for manufacturing a semiconductor device which minimizes the line width of a pattern and allows a low temperature oxide film and a thinly formed photoresist film to serve as ion blockers when performing an ion implantation process on the semiconductor substrate.

17 Claims, 3 Drawing Sheets

Figure 1:
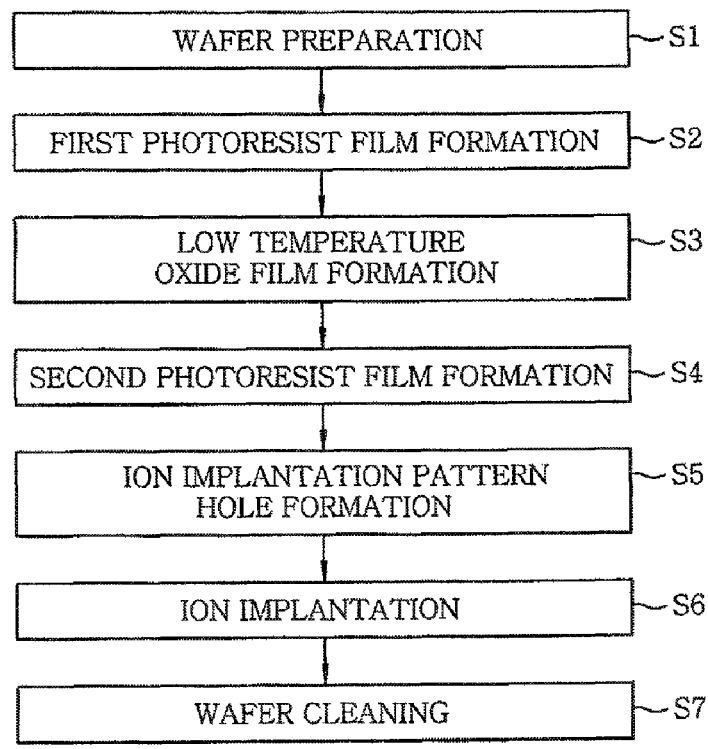

METHOD FOR MANUFACTURING SEMICONDUCTOR DEVICE INCLUDING IMPLANTING THROUGH A HOLE PATTERNED FROM A FIRST PHOTORESIST AN OXIDE AND A SECOND PHOTORESIST

The present application claims priority under 35 U.S.C. §119 to Korean Patent Application No. 10-2007-0106466 (filed on Oct. 23, 2007), the contents of which are incorporated in its entirety.

BACKGROUND

In keeping up with the recent tendency towards high integration and high performance of semiconductor devices, there is a demand for a semiconductor device structure in which the line width of the semiconductor device is small and interconnections are laminated. As a representative technique for forming a micro pattern on a semiconductor device, there is a photolithographic method for forming a micro pattern by using light. In accordance with the photolithographic method, a polymeric material (such as a photoresist and the like) having an optical sensitivity is coated on and/or over a substrate on and/or over which a material to be patterned is laminated or deposited. The polymeric material is then exposed to light through an exposure process which uses a reticle designed with a certain target patterning. Then, the exposed polymeric material is removed by a developing process so that a pattern mask or an etching mask having a target patterning may be formed on the material to be patterned. Thereafter, by performing an etching process with the pattern mask, the material laminated on and/or over the substrate can be patterned with a desired pattern. Further, the photolithographic method requires complex steps, such as etching, cleaning, deposition and the like, as well as the patterning process.

Currently, if the integrity of a semiconductor device is 130 nm, the photolithography process for implanting ions to a substrate has a design rule of a circuit line width of about 310 nm. If the integrity of a semiconductor device is 110 nm, the photolithography process for implanting ions to a substrate has a design rule of a circuit line width of about 220 nm. Accordingly, if the integrity of a semiconductor device is less than 90 nm, the photolithography process for implanting ions to a substrate is expected to have a design rule of a circuit line width of less than 200 nm. Further, if the integrity of a semiconductor device is less than 60 nm, the photolithography process for implanting ions to a substrate is expected to have a design rule of a circuit line width of less than 100 nm. With the miniaturization of the circuit line width of a semiconductor device to less than 100 nm, a photoresist film having a small thickness is required in order to implement an etching mask having a required micro-pattern. However, it is considerably difficult to reduce the thickness of the photoresist film, which has to serve as an ion block in an ion implantation process during the photolithography process for implanting ions to a substrate, as well as serving as an etching mask.

SUMMARY

Embodiments relate to a method for manufacturing a semiconductor device which minimizes the line width of a pattern and allows a thinly formed photoresist film and a low temperature oxide film to both serve as ion blockers during an ion implantation process.

Embodiments relate to a method for manufacturing a semiconductor device that may include at least one of the following steps: forming a first photoresist film on and/or over a semiconductor substrate; and then forming a low temperature oxide film on and/or over the first photoresist film; and then forming a second photoresist film on and/or over the low temperature oxide film; and then forming a pattern hole that penetrates the first photoresist film, the low temperature oxide film and the second photoresist film; and then doping the semiconductor substrate via the pattern hole; and then cleaning the semiconductor substrate.

Embodiments relate to a method for manufacturing a semiconductor device that may include at least one of the following steps: forming a first photoresist film over a semiconductor substrate; and then forming a low temperature oxide film over the first photoresist film; and then forming a second photoresist film over the low temperature oxide film; and then forming a pattern hole extending through the first photoresist film, the low temperature oxide film and the second photoresist film to expose a portion of the semiconductor substrate; and then doping the semiconductor substrate using the pattern hole; and then cleaning the semiconductor substrate.

Embodiments relate to a method that may include at least one of the following steps: forming a first photoresist film over a semiconductor substrate; and then forming an oxide film over the first photoresist film; and then forming a second photoresist film pattern over the oxide film; and then exposing a portion of the uppermost surface of the semiconductor substrate by forming a hole extending through the first photoresist film and the oxide film; and then implanting ions through the hole and in the exposed portion of the semiconductor substrate by performing an ion implantation process; and then performing a wet etching process to simultaneously clean the semiconductor substrate and removing the first photoresist film, the oxide film and the second photoresist film pattern after performing the ion implantation process.

Embodiments relate to an apparatus that may include at least one of the following: a semiconductor substrate; a first photoresist film formed over the semiconductor substrate; an oxide film formed over the first photoresist film; a second photoresist film pattern formed over the oxide film; and a pattern hole extending through the first photoresist film, the oxide film and the second photoresist film pattern to expose the semiconductor substrate, such that the pattern hole is formed according to the second photoresist film pattern.

In accordance with embodiments, the low temperature oxide film may be formed by depositing a low temperature oxide material at a temperature in a range between approximately 200 to 300° C. The etching of the low temperature oxide film and the first photoresist film may be done by argon (Ar) and sulfur oxide ($SO_x$). In the pattern hole formation step, a pattern mask may be formed by patterning the second photoresist film by exposure and developing, and the ion implantation pattern hole may be formed by etching the low temperature oxide film and the first photoresist film through the pattern mask. The wafer cleaning step may be performed by a wet cleaning process, and both of the pattern mask and low temperature oxide film may be removed, the first photoresist film may be removed by a wet cleaning process.

DRAWINGS

Example FIGS. 1 and 2 illustrate a method for manufacturing a semiconductor device in accordance with embodiments.

DESCRIPTION

Hereinafter, embodiments will be described in detail through an embodiment with 4reference to the accompanying drawing example figures.

Example FIG. 1 is a flow chart illustrating the steps of a method for manufacturing a semiconductor device in accordance with embodiments. Example FIGS. 2A to 2H illustrate cross-sectional views of a wafer for showing the steps of the method for manufacturing a semiconductor device in accordance with embodiments.

As illustrated in example FIG. 1, the method for manufacturing a semiconductor device in accordance with embodiments may include wafer preparation step S1, first photoresist film formation step S2, low temperature oxide film formation step S3, second photoresist film formation step S4, ion implantation pattern hole formation step S5, ion implantation step S6 and wafer cleaning step S7.

Figure 2A:
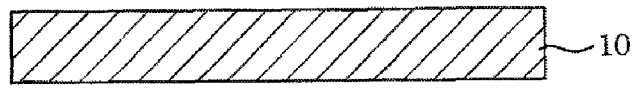

As illustrated in example FIG. 2A, wafer preparation step S1 is performed by preparing or otherwise providing wafer 10 for ion implantation. For example, wafer 10 may have at least one of a well formed therein and a gate electrode formed thereon and/or thereover.

Figure 2B:
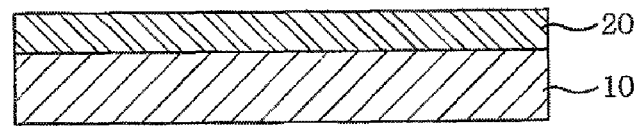

As illustrated in example FIG. 2B, first photoresist formation step S2 is performed by forming first photoresist film 20 on and/or over wafer 10. First photoresist film 20 makes it possible to remove a later-formed low temperature oxide film on and/or over first photoresist film 20 upon removal of first photoresist film 20 in the cleaning process after the ion implantation process. Although first photoresist film 20 may be formed at a thickness in a range between approximately 800 to 1200 Å, the thickness of first photoresist film 20 is not limited thereto.

Figure 2C:
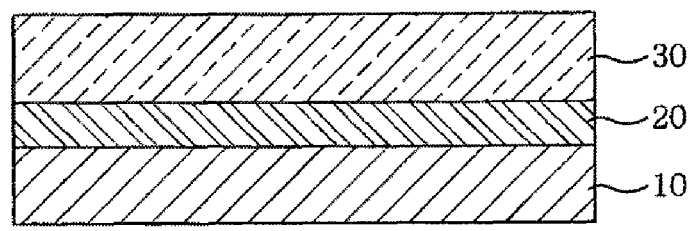

As illustrated in example FIG. 2C, low temperature oxide film formation step S3 is then performed by forming low temperature oxide film 30 on and/or over first photoresist film 20. Low temperature oxide film 30 serves as an ion block for preventing ions from being implanted into a undesired region of wafer 10 through first photoresist film 20 in the ion implantation process. Low temperature oxide film 30 may be formed at a thickness that maximizes blocking of ions. The process of depositing a low temperature oxide material on and/or over first photoresist film 20 to form low temperature oxide film 30 should be done at a low temperature, for example, in a range between approximately 200 to 300° C. in order to prevent hardening of first photoresist film 20. If the process of depositing a low temperature oxide material is done at a temperature of below 200° C., low temperature oxide film 30 cannot be formed properly, and hence cannot properly block ions. Further, if the process of depositing a low temperature oxide material is done at a temperature of over 300° C., first photoresist film 20 disposed below low temperature oxide film 30 is hardened, thereby making it difficult to remove first photoresist film 20 in a subsequent cleaning process. In the ion implantation process, low temperature oxide film 30 serves to block ions together with a photoresist film to be formed thereon. Therefore, it is possible to reduce the thickness of the photoresist film while retaining its function to block ions.

Figure 2D:
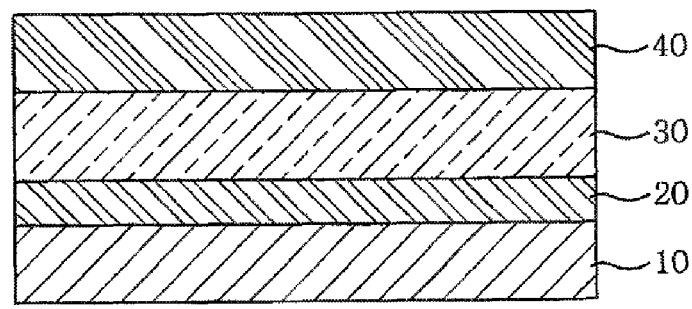

As illustrated in example FIG. 2D, second photoresist film formation step S4 may then be performed by forming second photoresist film 40 on and/or over low temperature oxide film 30. Second photoresist film 40 is deposited to form a pattern used for ion implantation on and/or over wafer 10. If second photoresist film 40 serves alone as the ion blocker during the ion implantation process, it should be formed having a larger thickness than it would otherwise. However, in accordance with embodiments, low temperature oxide film 30 also serves as an ion blocker with second photoresist film 40. Therefore, it is possible to reduce the thickness of second photoresist film 40. Accordingly, when carrying out light exposure with an exposure apparatus to form a pattern on and/or over second photoresist film 40, which is thinner than usual, the light exposure of second photoresist film 40 can be easily conducted. In other words, the exposure margin is enhanced during the process of the light exposure on and/or over second photoresist film 40 having a reduced thickness. Consequently, a micro-pattern is more easily implemented on and/or over second photoresist film 40 through the exposure, thereby realizing a circuit pattern having a small circuit line width on and/or over wafer 10.

Figure 2E:
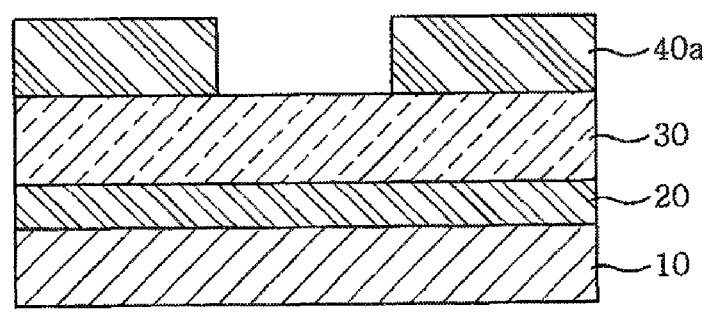
Figure 2F:
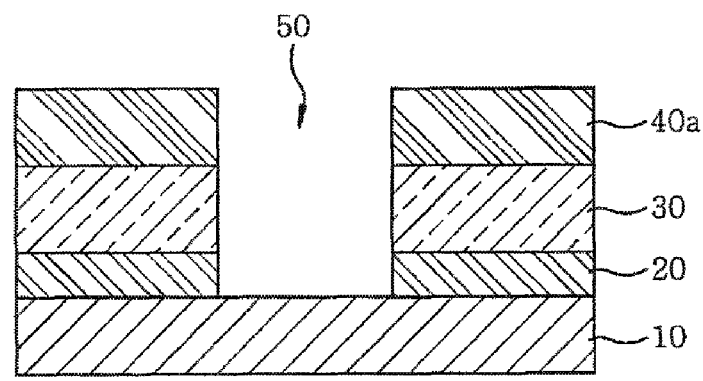

As illustrated in example FIGS. 2E and 2F, ion implantation pattern hole formation step S5 may then be performed by forming ion implantation pattern hole 50 by patterning second photoresist film 40 and then etching low temperature oxide film 30 and first photoresist film 20. Next, the patterning of second photoresist film 40 is done by the exposure and developing of second photoresist film 40. By patterning second photoresist film 40, pattern mask 40a to be used for forming ion implantation pattern hole 50 is formed. Afterwards, when low temperature oxide film 30 and first photoresist film 20 are etched using pattern mask 40a as a mask, ion implantation pattern hole 50 is formed. With this structure, ions can be implanted to a desired pattern of wafer 10 via ion implantation pattern hole 50. In the etching process of low temperature oxide film 30 and first photoresist film 20, argon (Ar) and sulfur oxide (Sox) are used to increase the etching selection ratio of low temperature oxide film 30 and first photoresist film 20.

Figure 2G:
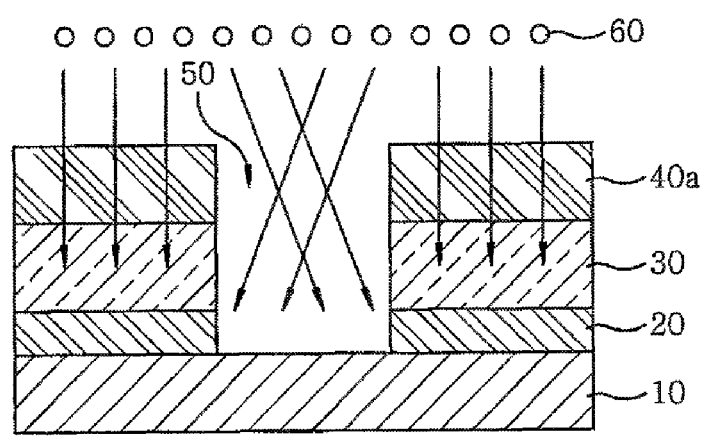

As illustrated in example FIG. 2G, ion implantation step S6 is then performed by implanting ions 60 into wafer 10 in which ion implantation pattern hole 50 is formed. Ions 60 are implanted into wafer 10 through ion implantation pattern hole 50, but are not implanted into region(s) of wafer 10 where ion implantation pattern hole 50 is not formed because the region(s) is blocked by pattern mask 40a and low temperature oxide film 30. The type of ions 60 may vary with the type of semiconductor device to be manufactured by wafer 10.

Figure 2H:

As illustrated in example FIG. 2H, wafer cleaning step S7 is then performed by cleaning ion-implanted wafer 10'. The cleaning of ion-implanted wafer 10' may be done by wet etching such that first photoresist film 20 is removed by the wet etching. Upon removal of first photoresist film 20, low temperature oxide film 30 and pattern mask 40a formed on and/or over first photoresist film 20 are also removed as well.

As described above, the method for manufacturing a semiconductor device in accordance with embodiments can realize a circuit pattern having a small circuit line width and allow a low temperature oxide film and a thinly formed photoresist film to combine to serve as an ion blocker in an ion implantation process.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device comprising:
   forming a first photoresist film over a semiconductor substrate; and then
   forming a low temperature oxide film over the first photoresist film; and then
   forming a second photoresist film over the low temperature oxide film; and then
   forming a pattern hole extending through the first photoresist film, the low temperature oxide film and the second photoresist film to expose a portion of the semiconductor substrate; and then
   doping the semiconductor substrate using the pattern hole; and then
   cleaning the semiconductor substrate.

2. The method of claim 1, wherein doping the semiconductor comprises implanting ions into the semiconductor substrate.

3. The method of claim 2, wherein the ions are implanted into the semiconductor substrate through the pattern hole.

4. The method of claim 3, wherein the ions are blocked in regions of the semiconductor substrate where the second photoresist and the low temperature oxide film are formed.

5. The method of claim 1, wherein the low temperature oxide film is formed by depositing a low temperature oxide material at a temperature in a range between approximately 200° C. to 300° C.

6. The method of claim 1, wherein forming the pattern hole comprises:
   patterning the second photoresist film to form a second photoresist pattern; and then
   etching the low temperature oxide film and the first photoresist film using the second photoresist pattern as a mask.

7. The method of claim 6, wherein cleaning the semiconductor substrate is performed by a wet cleaning process that removes the second photoresist pattern, the low temperature oxide film and the first photoresist film.

8. The method of claim 6, wherein the low temperature oxide film and the first photoresist film are etched using argon (Ar) and sulfur oxide ($SO_x$).

9. The method of claim 6, wherein the second photoresist film is patterned by a light exposure and development process.

10. The method of claim 1, wherein cleaning the semiconductor substrate is performed by a wet cleaning process.

11. The method of claim 10, wherein the wet cleaning process removes at least the low temperature oxide film and the first photoresist film.

12. A method comprising:
    forming a first photoresist film over a semiconductor substrate; and then
    forming an oxide film over the first photoresist film; and then
    forming a second photoresist film pattern over the oxide film; and then
    exposing a portion of the uppermost surface of the semiconductor substrate by forming a hole extending through the first photoresist film and the oxide film; and then
    implanting ions through the hole and in the exposed portion of the semiconductor substrate by performing an ion implantation process; and then
    performing a wet etching process to clean the semiconductor substrate and also remove the first photoresist film, the oxide film and the second photoresist film pattern after performing the ion implantation process.

13. The method of claim 12, wherein during performing the ion implantation process the ions are blocked in portions of the semiconductor substrate where the second photoresist and the oxide film are formed.

14. The method of claim 12, wherein the oxide film comprises a low temperature oxide film.

15. The method of claim 14, wherein the low temperature oxide film is formed at a temperature in a range between approximately 200° C. to 300° C.

16. The method of claim 12, wherein forming the pattern hole comprises:
    etching the oxide film and the first photoresist film using the second photoresist film pattern as a mask.

17. The method of claim 12, wherein the oxide film and the first photoresist film are etched using argon (Ar) and sulfur oxide ($SO_x$).

* * * * *